(12) United States Patent
Arai

(10) Patent No.: US 8,723,051 B2
(45) Date of Patent: May 13, 2014

(54) WIRING SUBSTRATE AND METHOD FOR MANUFACTURING WIRING SUBSTRATE

(75) Inventor: Rie Arai, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 77 days.

(21) Appl. No.: 13/479,833

(22) Filed: May 24, 2012

(65) Prior Publication Data

US 2012/0307470 A1 Dec. 6, 2012

(30) Foreign Application Priority Data

Jun. 3, 2011 (JP) .................................. 2011-125329

(51) Int. Cl.
*H05K 1/11* (2006.01)

(52) U.S. Cl.
USPC ........... 174/264; 174/255; 174/256; 174/258; 174/262; 174/265

(58) Field of Classification Search
CPC ............................... H05K 3/0306; H05K 3/10
USPC ........................................................ 174/264
See application file for complete search history.

(56) References Cited

U.S. PATENT DOCUMENTS

| | | | |
|---|---|---|---|
| 6,783,652 B2 | 8/2004 | Iijima et al. | |
| 6,958,544 B2 | 10/2005 | Sunohara | |
| 7,279,771 B2 | 10/2007 | Sunohara et al. | |
| 2004/0119166 A1* | 6/2004 | Sunohara | 257/758 |
| 2005/0025944 A1* | 2/2005 | Ogawa et al. | 428/209 |
| 2006/0237227 A1* | 10/2006 | Zhao et al. | 174/262 |
| 2011/0042130 A1* | 2/2011 | Lim et al. | 174/262 |
| 2011/0155441 A1* | 6/2011 | Tseng et al. | 174/266 |

FOREIGN PATENT DOCUMENTS

| | | |
|---|---|---|
| JP | 2002-171048 | 6/2002 |
| JP | 2004-158537 | 6/2004 |
| JP | 2005-294383 | 10/2005 |

* cited by examiner

*Primary Examiner* — Tuan T Dinh
*Assistant Examiner* — Steven T Sawyer
(74) *Attorney, Agent, or Firm* — IPUSA, PLLC

(57) ABSTRACT

A wiring substrate includes a substrate body formed of an inorganic material and including a first surface and a second surface, a first trench formed in a first surface side of the substrate body, a second trench formed in a second surface side of the substrate body, a penetration hole penetrating through the substrate body, a first plane layer filling the first trench, a second plane layer filling the second trench, and a penetration wiring filling the penetration hole. The first plane layer is a reference potential layer. The second plane layer is a power supply layer.

7 Claims, 6 Drawing Sheets

WIRING SUBSTRATE AND METHOD FOR MANUFACTURING WIRING SUBSTRATE

CROSS-REFERENCE TO RELATED APPLICATION

This application is based upon and claims the benefit of priority of the prior Japanese Patent Application No. 2011-125329 filed on Jun. 3, 2011, the entire contents of which are incorporated herein by reference.

FIELD

The present invention generally relates to a wiring substrate and a method for manufacturing a wiring substrate.

BACKGROUND

Conventionally, there is known a wiring substrate including plural wiring layers and plural insulating layers alternately layered on a substrate body formed of an inorganic material such as silicon, glass, or ceramic. The wiring substrate also includes adjacent wiring layers that have the insulating layers interposed therebetween and are connected by a via hole penetrating through the insulating layers.

FIG. 1 is a cross-sectional view of a wiring substrate 100 of a related art example. With reference to FIG. 1, the wiring substrate 100 includes a substrate body 110 having a first surface on which a GND (ground) plane layer 130 is formed. The wiring substrate 100 also includes a first insulating layer 160 covering the GND plane layer 130. The substrate body 110 has a second surface on which a power plane layer 140 is formed. The wiring substrate 100 also includes a second insulating layer 170 covering the power plane layer 140. Further, a penetration wiring 150, which penetrates through the substrate body 110, electrically connects between a wiring layer (not illustrated) formed on the first surface of the substrate body 110 and a wiring layer (not illustrated) formed on the second surface of the substrate body 110. It is to be noted that the substrate body 110 may be covered with an insulating film.

The GND plane layer 130 and the power plane layer 140 are formed relatively thick because the GND plane layer 130 and the power plane layer 140 are formed for stabilizing the ground or the electric potential of the power supply. A layer including the term "plane layer" is a layer that is flatly formed almost entirely on a predetermined surface. The ground plane layer 130 is formed almost entirely on the first surface of the substrate body 110 except at the vicinity of an end surface of the penetration wiring 150. The power plane layer 140 is formed almost entirely on the second surface of the substrate body 110 except at the vicinity of an end surface of the penetration wiring 150.

For example, a photosensitive polyimide type resin may be used to form the first and the second insulating layers 160, 170. Wiring layers (not illustrated) are formed on the first and the second insulating layers 160, 170, respectively. By forming a via hole penetrating through the first and the second insulating layers 160, 170, the wiring layers (not illustrated) formed on the first and the second insulating layers 160, 170 can be electrically connected to the penetration wiring 150.

Patent Document 1: Japanese Laid-Open Patent Publication No. 2005-294383
Patent Document 2: Japanese Laid-Open Patent Publication No. 2002-171048
Patent Document 3: Japanese Laid-Open Patent Publication No. 2004-158537

For example, in order to form the first and the second insulating layers 160, 170, a photosensitive polyimide type resin may be applied to the GND plane layer 130 and the power plane layer 140, and then cured. In many cases, the GND plane layer 130 and the power plane layer 140 are formed thicker than the wiring layers (not illustrated) formed on the first and the second insulating layers 160 and 170. Accordingly, the first and the second insulating layers 160, 170 (which are formed on the GND plane layer 130 and the power plane layer 140) tend to have a concavo-convex surface rather than a flat surface. In a case where concavities and convexities are formed on the surfaces of the first and the second insulating layers 160, 170, it is difficult to form wiring layers on the first and the second insulating layers 160, 170.

SUMMARY

According to an aspect of the invention, there is provided a wiring substrate including a substrate body formed of an inorganic material and including a first surface and a second surface, a first trench formed in a first surface side of the substrate body, a second trench formed in a second surface side of the substrate body, a penetration hole penetrating through the substrate body, a first plane layer filling the first trench, a second plane layer filling the second trench, and a penetration wiring filling the penetration hole, wherein the first plane layer is a reference potential layer, wherein the second plane layer is a power supply layer.

The object and advantages of the invention will be realized and attained by means of the elements and combinations particularly pointed out in the claims.

It is to be understood that both the foregoing generation description and the followed detailed description are exemplary and explanatory and are not restrictive of the invention, as claimed.

DESCRIPTION OF EMBODIMENTS

Figure 1:
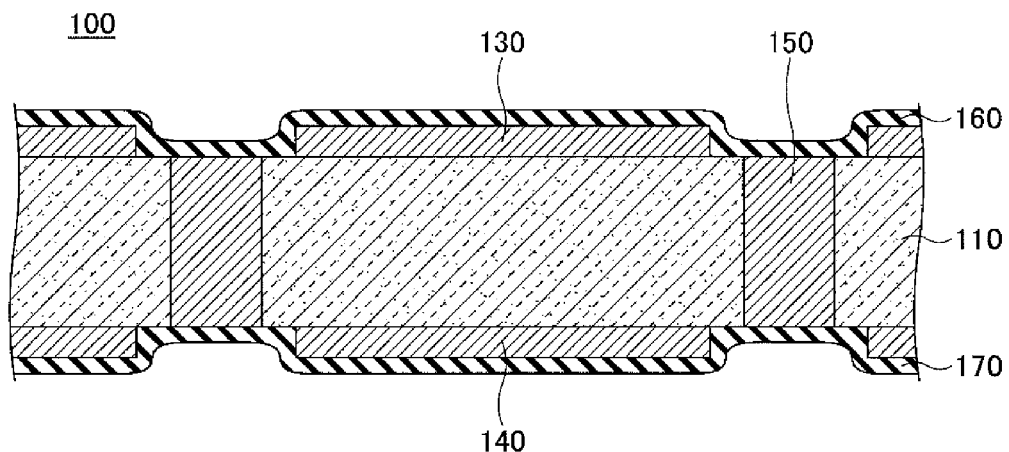
FIG. 1 is a cross-sectional view illustrating a wiring substrate according to a related art example.
Figure 2:
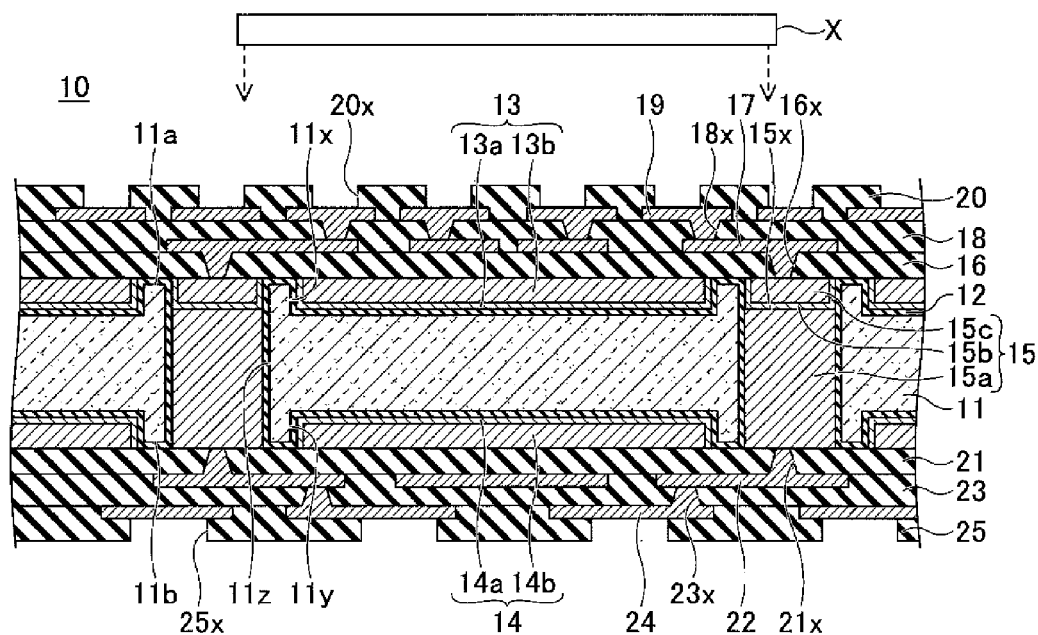
FIG. 2 is a cross-sectional view of a wiring substrate according to an embodiment of the present invention.

In the following, embodiments of the present invention will be described with reference to the accompanying drawings.
[Structure of Wiring Substrate]
First, a structure of a wiring substrate 10 according to an embodiment of the present invention is described. FIG. 2 is a cross-sectional view illustrating the wiring substrate 10 according to an embodiment of the present invention.

With reference to FIG. 2, the wiring substrate 10 includes a substrate body 11, an insulating film 12, a GND plane layer 13, a power plane layer 14, a penetration wiring 15, a first insulating layer 16, a first wiring layer 17, a second insulating layer 18, a second wiring layer 19, a third insulating layer 20, a fourth insulating layer 21, a third wiring layer 22, a fifth insulating layer 23, a fourth wiring layer 24, a sixth insulating layer 25.

The substrate body 11 is a part of the wiring substrate 10 serving as a base substrate on which a layer(s) such as the GND plane layer 13 is formed. Trenches 11x, 11y and a penetration hole 11z are formed in the substrate body 11. The substrate body 11 can be formed having a thickness of, for example, approximately 200 μm to 400 μm.

For example, an inorganic material such as silicon, glass, or ceramic may be used as the material of the substrate body 11.

It is to be noted that the wiring substrate 10 may be manufactured into a semiconductor package by mounting a semiconductor chip X on the wiring substrate 10. From the standpoint of matching the thermal expansion coefficient with respect to the semiconductor chip X, the material of the substrate body 11 is preferably silicon or a borosilicate glass having a thermal expansion coefficient similar to silicon because the semiconductor chip X, often includes a silicon substrate. The borosilicate glass is a glass mainly including boric acid ($B_2O_3$) or silicic acid ($SiO_2$) and has a thermal expansion coefficient of approximately 3 ppm/° C. In addition, from the standpoint of processing, the material of the substrate body 11 is preferably silicon.

The thermal expansion coefficient of the substrate body 11 is matched with the thermal expansion coefficient of the semiconductor chip X for reducing thermal stress generated at a bonding part between the substrate body 11 and the semiconductor chip X in view of operating under a high temperature atmosphere or a low temperature atmosphere. In this embodiment, the substrate body 11 is formed of silicon.

Figure 3:
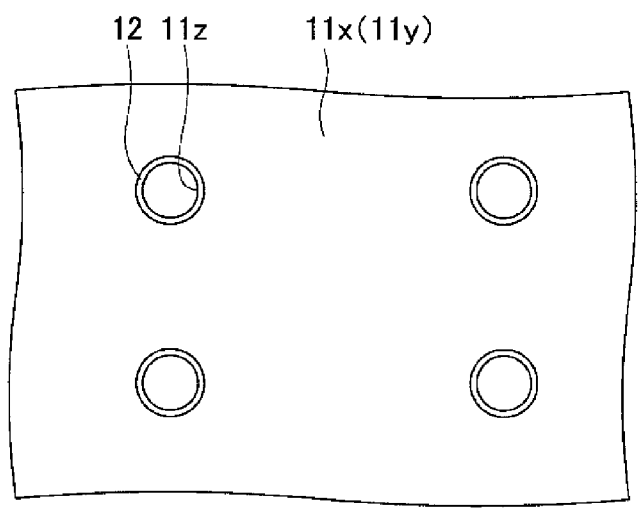
FIG. 3 is a plan view illustrating a positional relationship between a trench and a penetration hole according to an embodiment of the present invention.

The trench 11x is open on the side of a first surface 11a (first surface side) of the substrate body 11. As illustrated in FIG. 3, the trench 11x can be formed in a region excluding the penetration hole 11z and a part surrounding the penetration hole 11z from a plan view. Alternatively, the trench 11x may be in communication with a portion of the penetration hole 11z. The trench 11x corresponds to a portion of the substrate body 11 at which the GND plane layer 13 is formed. The plan view shape of the trench 11x may be, for example, a rectangle or a circle. The depth of the trench 11x may be, for example, approximately 20 μm to 50 μm.

The trench 11y is open on the side of a second surface 11b (second surface side) of the substrate body 11. As illustrated in a plan view of FIG. 3, the trench 11y can be formed in a region excluding the penetration hole 11z and a surrounding of the penetration hole 11z. Alternatively, the trench 11y may be in communication with a portion of the penetration hole 11z. The trench 11y corresponds to a portion of the substrate body 11 at which the power plane layer 14 is formed. The plan view shape of the trench 11y may be, for example, a rectangle or a circle. The depth of the trench 11y may be, for example, approximately 20 μm to 50 μm. The trench 11x and the trench 11y may be formed in areas superposing each other from a plane view. It is to be noted that neither the trench 11x nor the trench 11y is in communication with a penetration hole 11z shared by the trench 11x and the trench 11y.

Accordingly, although the trenches 11x, 11y may be formed in regions excluding the penetration hole 11z and a part surrounding the penetration hole 11z but are to be formed at least below an area on which the semiconductor chip X is mounted.

The penetration hole 11z is a hole penetrating through the substrate body 11 from the first surface side of the substrate body 11 to the second surface side of the substrate body 11. The penetration hole 11z has a substantially circular shape from a plan view. The diameter of the penetration hole 11z may be, for example, approximately 40 μm to 60 μm. The depth of the penetration hole 11z (thickness of the substrate body 11) may be, for example, approximately 200 μm to 400 μm.

The insulating film 12 is formed on the first and the second surfaces 11a, 11b of the substrate body 11, the inner bottom surfaces of the trenches 11x, 11y, and the inner side surfaces of the trenches 11x, 11y. The insulating film 12 is for insulating the substrate body 11 from the GND plane layer 13, the power plane layer 14, and the penetration wiring 15. For example, silicon dioxide ($SiO_2$), silicon nitride (SiN), or polyimide (PI) may be used as the material of the insulating film 12. The thickness of the insulating film 12 may be, for example, approximately 1 μm to 2 μm. In this embodiment, the insulating film 12 is provided because the substrate body 11 is formed of silicon (semiconductor material). However, in a case where the substrate body 11 is formed of an insulating material such as glass, the wiring substrate 10 may be formed without the insulating film 12.

The GND plane layer 13 is for stabilizing the potential of the ground (GND). The GND plane layer 13 fills the trench 11x having its inner side surface and inner bottom surface covered by the insulating film 12. In other words, the GND plane layer 13 is formed almost entirely on the first surface 11a of the substrate body 11 except at a part surrounding a first end surface of the penetration wiring 15 from a plan view. However, the GND plane layer 13 may be conducted with respect to a portion of the penetration wiring having the same potential as the GND plane layer 13. Further, the ground plane layer 13 is to be formed at least below an area on which the semiconductor chip X is mounted.

A top surface of the GND plane layer 13 (surface exposed at the first surface side of the substrate body 11) is substantially flush with a top surface of the insulating film 12 covering the first surface 11a of the substrate body 11. For the purpose of stabilizing the potential of the ground, it is preferable for the thickness of the GND plane layer 13 to be substantially greater than or equal to the thickness of, for example, the wiring pattern of the first wiring layer 17. The thickness of the GND plane layer 13 may be, for example, approximately 20 μm to 50 μm. As described above, the "plane layer" is a layer that is flatly formed almost entirely on a predetermined surface.

The GND plane layer 13 includes a first layer 13a and a second layer 13b. The first layer 13a covers the insulating film 12 covering the inner side surface and the inner bottom surface of the trench 11x. The first layer 13a may be, for example, a conductive layer formed by layering a titanium (Ti) film and a copper (Cu) film on the insulating film 12 in this order. The thickness of the first layer 13a may be, for example, approximately 1 μm. The second layer 13b covers the first layer 13a and fills the trench 11x. For example, copper (Cu) may be used as the material of the second layer 13b.

By using a titanium (Ti) film as the lowermost layer of the first layer 13a, a satisfactory adhesiveness between the first layer 13a and the insulating film 12 can be attained in a case where the material of the insulating film 12 is silicon dioxide ($SiO_2$) or silicon nitride (SiN). Accordingly, unlike a case where the second layer 13b directly contacts the insulating film 12, a space(s) between the GND plane layer 13 and the insulating film 12 can be prevented from being formed as a result of poor adhesiveness. Thus, the second layer 13b is adhered to the insulating film 12 interposed by the first layer 13a. The GND plane layer 13 is a representative example of a reference potential layer according to an embodiment of the present invention.

The power plane layer 14 is for stabilizing the potential of the power supply. The power plane layer 14 fills the trench 11y having its inner side surface and inner bottom surface covered by the insulating film 12. In other words, the power plane layer 14 is formed almost entirely on the second surface 11b of the substrate body 11 except at a part surrounding a second end surface of the penetration wiring 15 from a plan view. However, the power plane layer 14 may be conducted with respect to a portion of the penetration wiring having the same potential as the power plane layer 14. Further, the power plane layer 14 is to be formed at least below an area on which the semiconductor chip X is mounted.

A top surface of the power plane layer 14 (surface exposed at the second surface side of the substrate body 11) is substantially flush with a top surface of the insulating film 12 covering the second surface 11b of the substrate body 11. For the purpose of stabilizing the potential of the power supply, it is preferable for the thickness of the power plane layer 14 to be substantially greater than or equal to the thickness of, for example, the wiring pattern of the first wiring layer 17. The thickness of the power plane layer 14 may be, for example, approximately 20 μm to 50 μm.

The power plane layer 14 includes a first layer 14a and a second layer 14b. The first layer 14a covers the insulating film 12 covering the inner side surface and the inner bottom surface of the trench 11y. The first layer 14a may be, for example, a conductive layer formed by layering a titanium (Ti) film and a copper (Cu) film on the insulating film 12 in this order. The thickness of the first layer 14a may be, for example, approximately 1 μm.

The second layer 14b covers the first layer 14a and fills the trench 11y. For example, copper (Cu) may be used as the material of the second layer 14b.

By using a titanium (Ti) film as the lowermost layer of the first layer 14a, the power plane layer 14 can attain a satisfactory adhesiveness between the first layer 14a and the insulating layer 12 in a case where the material of the insulating film 12 is silicon dioxide ($SiO_2$) or silicon nitride (SiN). Accordingly, unlike a case where the second layer 14b directly contacts the insulating film 12, a space(s) between the power plane layer 14 and the insulating film 12 can be prevented from being formed as a result of poor adhesiveness. Thus, the second layer 14b is adhered to the insulating film 12 interposed by the first layer 14a. The power plane layer 14 is a representative example of a power layer (power supply layer) according to an embodiment of the present invention.

It is to be noted that the GND plane layer 13 and the power plane layer 14 do not need to be formed symmetrical to each other.

The penetration wiring 15 fills the penetration hole 11z having its inner side surface covered by the insulating film 12. The penetration wiring 15 includes a first layer 15a, a second layer 15b, and a third layer 15c. The first layer 15a fills a portion of the penetration hole 11z. In this embodiment, the first layer 15a fills the penetration hole 11z except for an upper portion (toward the first surface 11a of the substrate body 11) of the penetration hole 11z having its inner side surface covered by the insulating film 12. A top surface of the first layer 15a is in a position in which the first surface 11a is recessed toward the second surface 11b of the substrate body 11. In other words, the top surface of the first layer 15a and a portion of the insulating film 12 covering the inner side surface of the penetration hole 11z constitute a recess part 15x. The depth of the recess part 15x may be, for example, approximately 50 μm. For example, copper (Cu) may be used as the material of the first layer 15a. A surface of the first layer 15a exposed toward the second surface side of the substrate body 11 is substantially flush with a surface of the insulating film 12 covering the second surface 11b of the substrate body 11.

The second layer 15b is formed inside the recess part 15x. More specifically, in this embodiment, the second layer 15b covers the top surface of the first layer 15a and a portion of the insulating film 12 covering the inner side surface of the penetration hole 11z. The second layer 15b may be, for example, a conductive layer formed by layering a titanium (Ti) film and a copper (Cu) film on the insulating film 12 and the first layer 15a in this order. The thickness of the second layer 15b may be, for example, approximately 1 μm. The third layer 15c covers the second layer 15b and fills the recess part 15x. The top surface of the third layer 15c (i.e. surface of the penetration wiring 15 exposed on the first surface side of the substrate body 11) is substantially flush with the surface of the insulating film 12 covering the first surface 11a of the substrate body 11. For example, copper (Cu) may be used as the material of the third layer 15c.

By using a titanium (Ti) film as the lowermost layer of the second layer 15b, the penetration wiring 15 can attain a satisfactory adhesiveness with respect to the insulating layer 12 in a case where the material of the insulating film 12 is silicon dioxide ($SiO_2$) or silicon nitride (SiN). Accordingly, unlike a case where the third layer 15c directly contacts the insulating film 12, a space(s) between the third layer 15c and the insulating film 12 can be prevented from being formed as a result of poor adhesiveness. Thus, the third layer 15c is adhered to the insulating film 12 interposed by the second layer 15b.

Alternatively, the first layer 15a may fill up the entire penetration hole 11z (including the upper portion of the penetration hole 11z toward the trench 11x) having its inner surface covered by the insulating film 12. In this case, the top surface of the first layer 15a (i.e. surface toward the trench 11x) is substantially flush with the top surface of the insulating film 12 covering the first surface 11a of the substrate body 11. In this case, the penetration wiring 15 may be formed without a recess part 15x.

It is, however, to be noted that the first layer 15a is preferred not to project from the top surface of the insulating film 12 covering the first surface 11a of the substrate body 11. In such a case where the first layer 15a projects from the top surface of the insulating film 12 covering the first surface 11a of the substrate body 11, the projection would prevent the second layer 15b from satisfactorily covering the first layer 15a and the insulating film 12. This may lead to problems such as peeling or disconnection of the second layer 15b. In order to avoid such problems, the first layer 15a fills the penetration hole 11z to a degree that the top surface of the first layer 13a (i.e. surface toward the trench 11x) is in a position in which the first surface 11a is recessed toward the second surface 11b of the substrate body 11. That is, in this embodiment, the recess part 15x is formed.

In this embodiment, the second layer 15b is interposed between the first and the third layers 15a, 15c. This owes to the processes of the following method for manufacturing the wiring substrate 10 according to an embodiment of the present invention. As described in the following method for manufacturing the wiring substrate 10 according to an embodiment of the present invention, the first and the third layers 15a, 15c can prevent the generation of defects such as seams and voids.

The first insulating layer 16 is formed on the first surface 11a of the substrate body 11. The first insulating layer 16 covers the GND plane layer 13 and a first end surface of the penetration wiring 15. For example, an insulating resin such as a photosensitive polyimide type resin may be used as the material of the first insulating layer 16. The thickness of the first insulating layer 16 may be, for example, approximately 15 μm to 25 μm.

The first wiring layer 17 is formed on the first insulating layer 16. The first wiring layer 17 includes a via wiring that fills a first via hole 16x and a wiring pattern that is formed on the first insulating layer 16. The first via hole 16x penetrates through the first insulating layer 16 and exposes the first end surface of the penetration wiring 15. The wiring pattern of the first wiring layer 17 is patterned into a predetermined flat shape. The first via hole 16x has an opening part toward the second insulating layer 18 and a bottom surface part formed by the first end surface of the penetration wiring 15. Accordingly, in this embodiment, the first via hole 16x is a recess part having a circular conical shape in which the area of the opening part is larger than the area of the bottom surface part. Further, the via wiring is formed inside the recess part.

The first wiring layer 17 is electrically connected to the penetration wiring 15 exposed at the first via hole 16x. For example, copper (Cu) may be used as the material of the first wiring layer 17. The thickness of the wiring pattern constituting the first wiring layer 17 may be, for example, approximately 10 μm to 20 μm.

The second insulating layer 18 is formed on the first insulating layer 16 and covers the first wiring layer 17. The material of the second insulating layer 18 may be the same as that of the first insulating layer 16. The thickness of the second insulating layer 18 may be, for example, approximately 15 μm to 25 μm.

The second wiring layer 19 is formed on the second insulating layer 18. The second wiring layer 19 includes a via wiring that fills a second via hole 18x and a wiring pattern that is formed on the second insulating layer 18. The second via hole 18x penetrates through the second insulating layer 18 and exposes the top surface of the first wiring layer 17. The wiring pattern of the second wiring layer 19 is patterned into a predetermined flat shape. The second via hole 18x has an opening part toward the third insulating layer 20 and a bottom surface part formed by the top surface of the first wiring layer 17. Accordingly, in this embodiment, the second via hole 18x is a recess part having a circular conical shape in which the area of the opening part is larger than the area of the bottom surface part. Further, the via wiring is formed inside the recess part.

The second wiring layer 19 is electrically connected to the exposed first wiring layer 17 in the second via hole 18x. For example, copper (Cu) may be used as the material of the second wiring layer 19. The thickness of the wiring pattern constituting the second wiring layer 19 may be, for example, approximately 10 μm to 20 μm.

The third insulating layer 20 is formed on the second insulating layer 18 and covers the second wiring layer 19. The third insulating layer 20 includes an opening part 20x. At least a portion of the second wiring layer 19 is exposed at the opening part 20x. The material of the third insulating layer 20 may be the same as that of the first insulating layer 16. The thickness of the third insulating layer 20 may be, for example, approximately 15 μm to 25 μm.

The second wiring layer 19 exposed at the opening part 20x functions as an electrode pad that is electrically connected to the semiconductor chip X. The second wiring layer 19 exposed at the opening part 20x is also hereinafter referred to as "first electrode pad 19". According to necessity, a metal layer may be formed on the first electrode pad 19.

For example, the metal layer may be a gold (Au) layer, a nickel/gold (Ni/Au) layer (i.e. a metal layer including a Ni layer and a Au layer layered in this order), or a nickel/palladium/gold (Ni/Pd/Au) layer (i.e. a metal layer including a Ni layer, a Pd layer, and a Au layer layered in this order).

Further, an external connection terminal (e.g., solder ball, lead pin) may be formed on the first electrode pad 19 or a metal layer in a case where the metal layer is formed on the first electrode pad 19. The external connection terminal is for electrically connecting to the semiconductor chip X. It is, however, to be noted that the first electrode pad 19 itself may be used as the external connection terminal. In a case where a metal layer is formed on the first electrode pad 19, the metal layer itself may be used as the external connection terminal.

The first electrode pad 19 is flat and has a shape of, for example, a circle. The diameter of the circle is, for example, approximately 100 μm to 200 μm.

Similarly, the fourth insulating layer 21, the third wiring layer 22, the fifth insulating layer 23, the fourth wiring layer 24, and the sixth insulating layer 25 are sequentially layered on the second surface 11b of the substrate body 11. The third wiring layer 22 is electrically connected to the penetration wiring 15 by way of a third via hole 21x. The fourth wiring layer 24 is electrically connected to the third wiring layer 22 by way of a fourth via hole 23x. A detailed description of the fourth insulating layer 21, the third wiring layer 22, the fifth insulating layer 23, and the fourth wiring layer 24 is omitted because the fourth insulating layer 21, the third wiring layer 22, the fifth insulating layer 23, and the fourth wiring layer 24 have substantially the same configuration as that of the above-described first insulating layer 16, the first wiring layer 17, the second insulating layer 18, and the second wiring layer 19, respectively.

The sixth insulating layer 25 is formed on the fifth insulating layer 23 and covers the fourth wiring layer 24. The sixth insulating layer 25 includes an opening part 25x. At least a portion of the fourth wiring layer 24 is exposed at the opening part 25x. The material of the sixth insulating layer 25 may be the same as that of the first insulating layer 16. The thickness of the sixth insulating layer 25 may be, for example, approximately 15 μm to 25 μm.

The fourth wiring layer 24 exposed at the opening part 25x functions as an electrode pad that is electrically connected to a mount board such as a motherboard (not illustrated). The fourth wiring layer 24 exposed at the opening part 25x is also hereinafter referred to as "second electrode pad 24". According to necessity, a metal layer may be formed on the second electrode pad 24. For example, the metal layer may be a gold (Au) layer, a nickel/gold (Ni/Au) layer (i.e. a metal layer including a Ni layer and a Au layer layered in this order), or a nickel/palladium/gold (Ni/Pd/Au) layer (i.e. a metal layer including a Ni layer, a Pd layer, and a Au layer layered in this order).

Further, an external connection terminal (e.g., solder ball, lead pin) may be formed on the second electrode pad 24 or a metal layer in a case where the metal layer is formed on the second electrode pad 24. The external connection terminal is for electrically connecting to a mount board such as a motherboard (not illustrated). It is, however, to be noted that the second electrode pad 24 itself may be used as the external connection terminal. In a case where a metal layer is formed on the second electrode pad 24, the metal layer itself may be used as the external connection terminal.

The second electrode pad 24 is flat and has a shape of, for example, a circle. The diameter of the circle is, for example, approximately 200 μm to 1000 μm.

In other words, the diameter of the second electrode pad 24 (which is to be electrically connected to a mount board such as a motherboard (not illustrated)) is greater than the diameter of the first electrode pad 19 (which is to be electrically connected to the semiconductor chip X. The pitch between the second electrode pads 24 may be, for example, approximately 500 μm to 1200 μm. In other words, the pitch between the second electrode pads 24 (which are to be electrically connected to a mount board such as a motherboard (not illustrated)) is greater than the pitch between the first electrode pads 19 (which are to be electrically connected to the semiconductor chip X.

Accordingly, the side of the wiring substrate 10 on which the GND plane layer 13 is formed is the side on which the semiconductor chip X is to be mounted. Owing to this configuration of the wiring substrate 10, the GND plane layer 13 can be easily connected to the GND of a semiconductor chip X. Further, owing to this configuration of the wiring substrate 10, the GND plane layer 13 can be used as a ground layer of a microstrip line that contributes to the reduction of signal transmission loss of a signal layer including the first and the second wiring layers 17, 19. Assuming that the GND plane layer 13 is formed on the side of the wiring substrate 10 on which a mount board such as a motherboard (not illustrated) is to be mounted (i.e. second surface side of the substrate body 11), the GND plane layer 13 and a signal layer including the first and the second wiring layers 17, 19 would be far from each other. As a result, it would be difficult for the GND plane layer 13 to function as the ground of a microstrip line, and signal transmission loss is increased.

[Method for Manufacturing Wiring Substrate]

Next, a method for manufacturing a wiring substrate according to an embodiment of the present invention is described. FIGS. 4 to 12 illustrate the steps of the method for manufacturing a wiring substrate according to an embodiment of the present invention.

Figure 4:
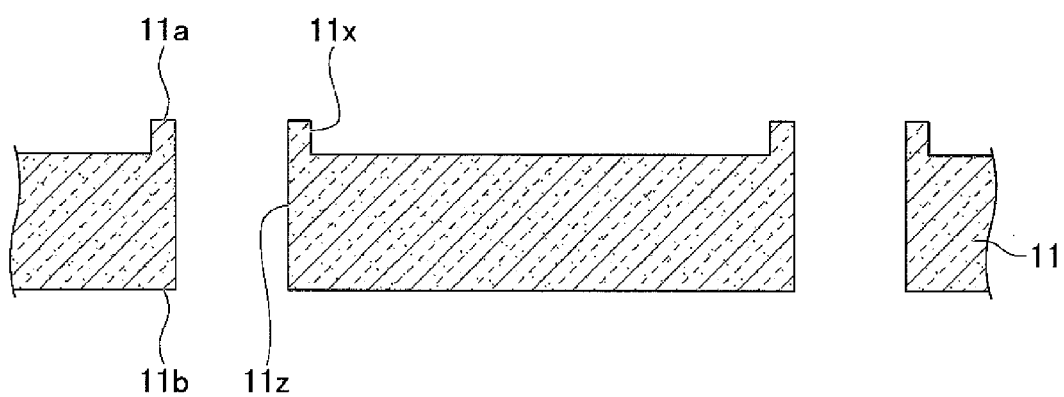
FIGS. 4 to 12 are schematic diagrams illustrating processes of a method for manufacturing a wiring substrate according to an embodiment of the present invention.

First, in the process illustrated in FIG. 4, the substrate body 11 is prepared. Then, the trench 11x and the penetration hole 11z are formed on the first surface side of the substrate body 11. The penetration hole 11z penetrates through the substrate body 11 from the first surface 11a to the second surface 11b. The trench 11x is an area at which the GND plane layer 13 is to be formed. For example, the substrate body 11 may be a silicon wafer having a length of 6 inches (approximately 150 mm), 8 inches (approximately 200 mm), or 12 inches (approximately 300 mm). The thickness of the silicon wafer may be, for example, 0.625 mm (in a case of a 6 inch wafer), 0.725 mm (in a case of an 8 inch wafer), or 0.775 mm (in a case of a 12 inch wafer). It is, however, to be noted that, the thickness of the silicon wafer may be reduced by using, for example, a back-side grinder.

For example, a resist layer is formed on the first surface 11a of the substrate body 11. The resist layer has openings corresponding to areas at which the trench 11x and the penetration hole 11z are to be formed. Then, the substrate body 11 is etched by using the resist layer as a mask. Thereby, the trench 11x and the penetration hole 11z are formed. It is preferable for the etching to be anisotropic etching such as deep reactive ion etching (DRIE) using sulfur hexafluoride ($SF_6$). The trench 11x is formed by etching the substrate body 11 to a predetermined depth. The penetration hole 11z is formed by etching the substrate body 11 until the substrate body 11 is penetrated. The depth of the trench 11x may be, for example, approximately 40 μm to 60 μm. The depth of the penetration hole 11z (thickness of the substrate body 11) may be, for example, approximately 200 μm to 400 μm.

Figure 5:
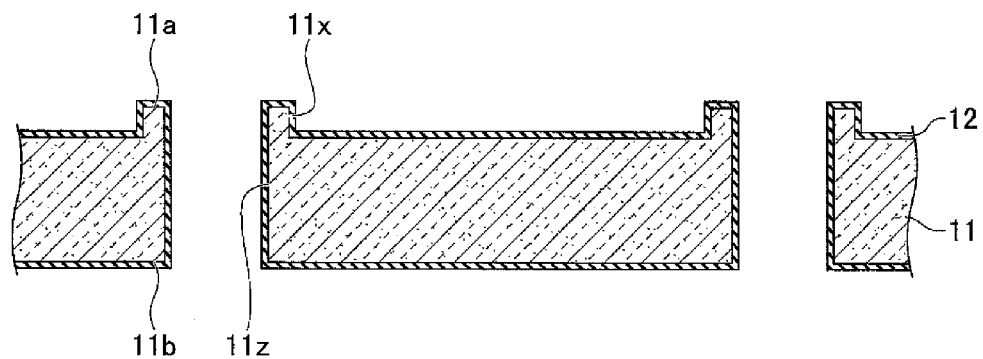

Then, in the process illustrated in FIG. 5, the insulating film 12 is formed on the first and second surfaces 11a, 11b of the substrate body 11, the inner bottom surface and the inner side surface of the trench 11x, and the inner side surface of the penetration hole 11z. The insulating film 12 may be, for example, a silicon oxide ($SiO_2$) film. The insulating film 12 may be formed by performing thermal oxidation using a wet thermal oxidation method on the substrate body 11 in which the vicinity of the surface of the substrate body 11 is heated to a temperature of, for example, 1000° C., or more. The thickness of the insulating film 12 may be, for example, approximately 1 μm to 2 μm. Alternatively, the insulating film 12 may be a silicon dioxide ($SiO_2$) film, a silicon nitride (SiN) film, or a polyimide film formed by using, for example, a chemical vapor deposition (CVD) method.

Figure 6:
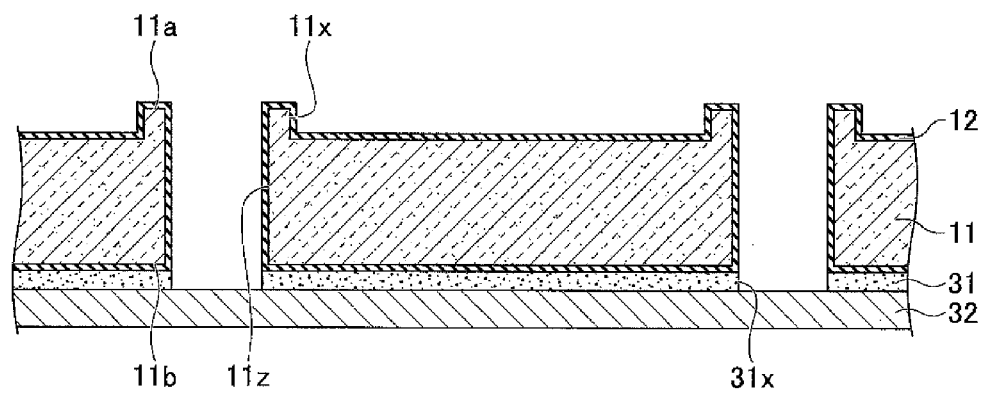

Then, in the process illustrated in FIG. 6, a metal layer 32 is formed on the insulating film covering the second surface 11b interposed by an adhesive layer 31. Then, an opening part 31x is formed by removing (e.g., ashing) a portion of the adhesive layer 31 corresponding to the penetration hole 11z having its inner side surface covered by the insulating film 12. Thereby, a top surface of the metal layer 32 is exposed at the penetration hole 11z having its inner side surface covered by the insulating film 12. The metal layer 32 is a member to be used as a feeding layer when forming, for example, the penetration wiring by using an electroplating method. For example, a copper (Cu) plate or a copper (Cu) foil may be used as the material of the metal layer 32. In this embodiment, a copper (Cu) plate is used as the metal layer 32.

Figure 7:
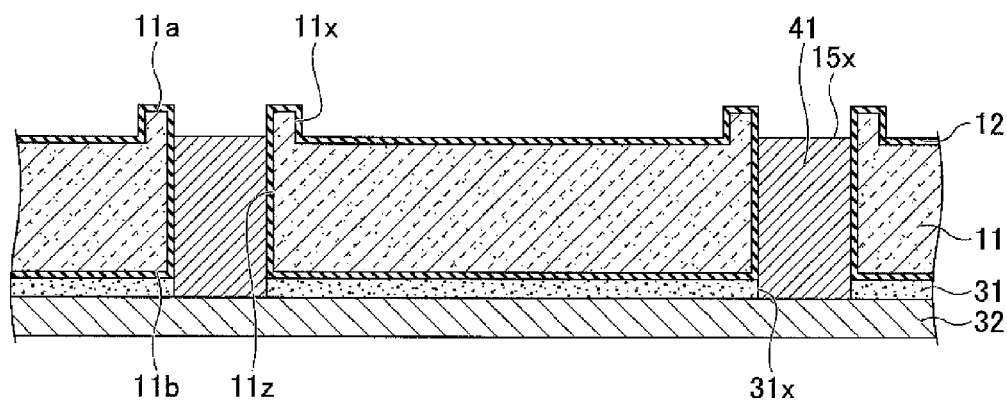

Then, in the process illustrated in FIG. 7, a plating film is deposited (grown) inside the penetration hole 11z from the side of the metal layer 32 by performing an electroplating method using the metal layer 32 as a power feed layer (power supply layer). Thereby, a conductive layer 41 filling at least a portion of the penetration hole 11z is formed. By removing an unnecessary portion of, for example, the conductive layer 41, the conductive layer 41 eventually becomes the first layer 15a of the penetration wiring 15. For example, copper (Cu) may be used as the material of the conductive layer 41. The conductive layer 41 fills the penetration hole 11z except for a top part of the penetration hole 11z. For example, the conductive layer 41 fills the penetration hole 11z except for a top part of the penetration hole 11z that corresponds to the depth of the trench 11x. In this case, the recess part 15x is formed by the top surface of the conductive layer 41 (i.e. surface of the conductive layer 41 toward the trench 11x) and the insulating film 12 covering the inner side surface of the penetration hole 11z.

As described above, the conductive layer 41 may be formed filling the entire penetration hole 11z (including the top part of the penetration hole 11z (toward the trench 11x)) having its inner side surface covered by the insulating film 12. That is, the conductive layer 41 may be formed, so that the top surface of the conductive layer 41 (i.e. surface of the conductive layer 41 toward the trench 11x) is substantially flush with the top surface of the insulating film 12 covering the first surface 11a of the substrate body 11. Nevertheless, it is not preferable to form the conductive layer 41 projecting from the top surface of the insulating film 12 covering the first surface 11a of the substrate body 11. The depth of the recess part 15x may be, for example, approximately 0 μm to 10 μm.

Because the inner side surface of the penetration hole 11z is covered by the insulating film 12, the conductive layer 41 can be formed by growing a plating film only from one side (in this embodiment, from the side of metal layer 32). Accordingly, unlike the wiring substrate 100 of the related art example, the generation of, for example, seams or voids due to growing plating films from two directions can be prevented. As a result, the first layer 15a of the penetration wiring 15 (i.e. final product of the conductive layer 41) can be prevented from being disconnected by thermal pressure due to the generation of, for example, seams or voids. Further, the first layer 15a of the penetration wiring 15 can prevent reduction of connection reliability with respect to the first wiring layer 17 or the third wiring layer 22.

Figure 8:
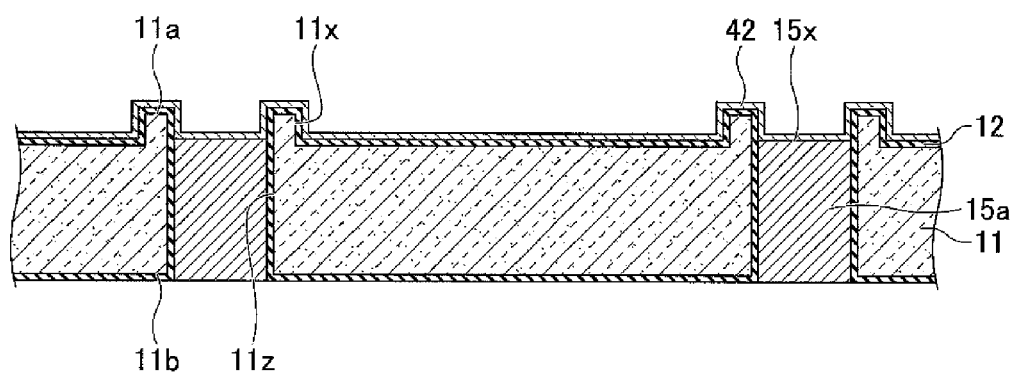

Then, in the process illustrated in FIG. 8, a conductive layer 42 is formed. The conductive layer 42 covers the insulating film 12 covering the first surface 11a of the substrate body 11, the inner bottom surface of the trench 11x, and the inner side surface of the trench 11x along with a surface of the recess part 15x. After forming the conductive layer 42, the adhesive layer 31 and the metal layer 32 illustrated in FIG. 7 are removed. Further, a portion of the conductive layer 41 which projects from the second surface side of the substrate body 11 is polished (see, for example, FIG. 7). Thereby, the first layer 15a of the penetration wiring 15 is formed.

The conductive layer 42 may be formed by, for example, a sputtering method. By removing an unnecessary portion of, for example, the conductive layer 42, the conductive layer 42 eventually becomes the first layer 13a of the GND plane layer 13 and the second layer 15b of the penetration wiring 15. The conductive layer 42 may be formed by layering a titanium (Ti) film and a copper (Cu) film on the insulating layer 12 or the conductive layer 41 (see, for example, FIG. 7) in this order. The conductive layer 42 may have a thickness of, for example, approximately 1 μm. It is to be noted that the conductive layer 42 is a representative example of a second feed layer according to an embodiment of the present invention.

The metal layer (in this embodiment, a copper (Cu) plate) 32 can be removed by, for example, a wet-etching method using a solution such as a ferric chloride solution, a cupric chloride solution, or an ammonium persulfate solution. The adhesive layer 31 can be removed by, for example, an ashing method. The conductive layer 41 may be polished by, for example, a chemical mechanical polishing (CMP) method. The bottom surface of the first layer 15a of the penetration wiring 15 (i.e. a surface of the conductive layer 41 opposite from the surface toward the trench 11x) is substantially flush with a bottom surface of the insulating film 12 covering the second surface 11b of the substrate body 11. It is to be noted that the first layer 15a is a representative example of a first feed layer according to an embodiment of the present invention.

Figure 9:
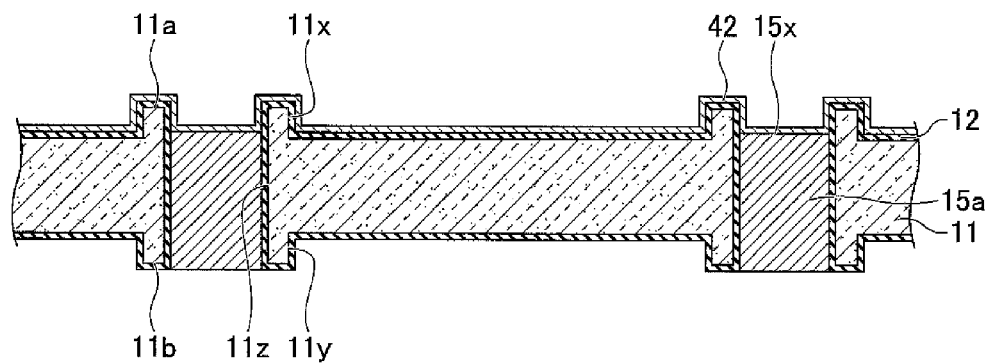

Then, in the process illustrated in FIG. 9, the trench 11y is formed on the second surface side of the substrate body 11. Then, the insulating film 12 is formed on the inner bottom surface of the trench 11y and the inner side surface of the trench 11y. The trench 11y is an area at which the power plane layer 14 is to be formed. The trench 11y may be formed by using the same method for forming the trench 11x. The material of the insulating film 12, the thickness of the insulating film 12, and method for forming the insulating film 12 are the same as those illustrated, in for example, FIG. 5

Figure 10:
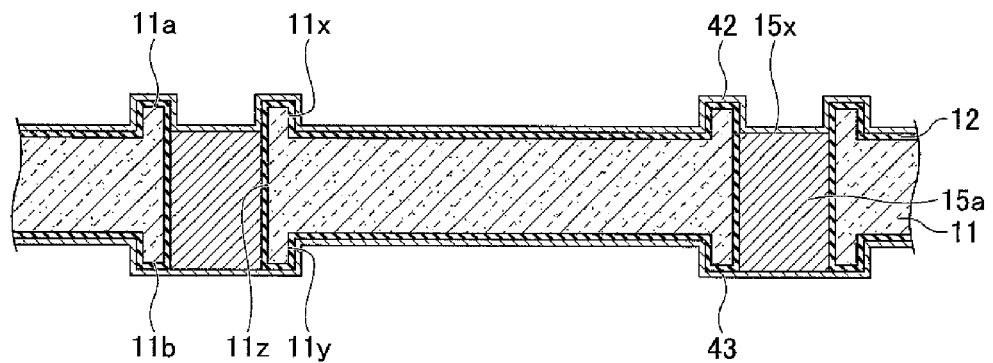

Then, in the process illustrated in FIG. 10, a conductive layer 43 is formed. The conductive layer 43 covers the insulating film 12 covering the second surface 11b of the substrate body 11, the inner bottom surface of the trench 11y, and the inner side surface of the trench 11y along with an end surface of the first layer 15a on the second surface side of the substrate body 11. The conductive layer 43 may be formed by, for example, a sputtering method. By removing an unnecessary portion of, for example, the conductive layer 43, the conductive layer 43 eventually becomes the first layer 14a of the power plane layer 14. The conductive layer 43 may be formed by layering a titanium (Ti) film and a copper (Cu) film on the insulating layer 12 and on the end surface of the first layer 15a on the second surface side of the substrate body 11 in this order. The conductive layer 43 may have a thickness of, for example, approximately 1 μm. It is to be noted that the conductive layer 43 is a representative example of a third feed layer according to an embodiment of the present invention.

Figure 11:
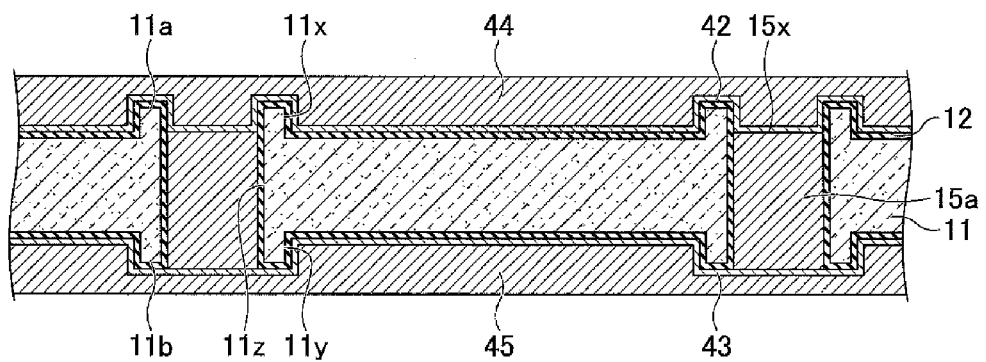

Then, in the process illustrated in FIG. 11, a plating film is deposited (grown) inside the trench 11x and the recess part 15x from the side of the conductive layer 42 and another plating film is deposited (grown) inside the recess part 11y from the side of the conductive layer 43 by performing an electroplating method using the first layer 15a, the conductive layer 42, and the conductive layer 43 as a power feed layer (power supply layer). Thereby, a conductive layer 44 and a conductive layer 45 are formed. The conductive layer 44 and the conductive layer 45 may be formed simultaneously. By removing an unnecessary portion of, for example, the conductive layer 44, the conductive layer 44 eventually becomes the second layer 13b of the GND plane layer 13 and the third layer 15c of the penetration wiring 15. Further, by removing an unnecessary portion of, for example, the conductive layer 45, the conductive layer 45 eventually becomes the second layer 14b of the power plane layer 14.

For example, copper (Cu) may be used as the material of the conductive layers 44, 45. The conductive layer 44 is formed projecting from the top surface of the insulating film 12 covering the first surface 11a of the substrate body 11. The conductive layer 45 is formed projecting from the top surface of the insulating film 12 covering the second surface 11b of the substrate body 11. The degree in which the conductive layers 44, 45 project from the top surface of the corresponding insulating films 12 is, for example, approximately 30 μm to 40 μm, respectively.

Figure 12:
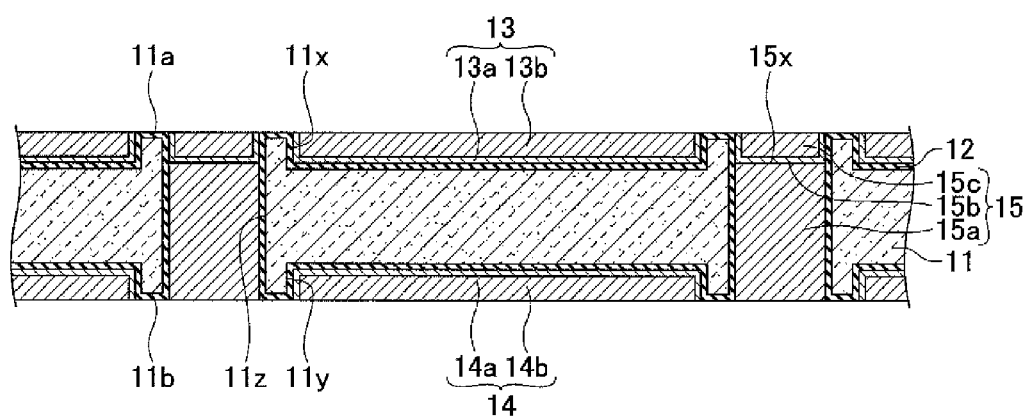

Then, in the process illustrated in FIG. 12, the conductive layer 44 projecting from the first surface side of the substrate body 11 (see, for example, FIG. 11) is polished by, for example, a chemical mechanical polishing (CMP) method. Thereby, the second layer 13b of the GND plane layer 13 and the third layer 15c of the penetration wiring 15 are formed. The top surface of the second layer 13b of the GND plane layer 13 and the top surface of the third layer 15c of the penetration wiring 15 are substantially flush with the top surface of the insulating film 12 covering the first surface 11a of the substrate body 11. Further, the second layer 14b of the power plane layer 14 is formed by polishing the conductive layer 45 projecting from the second surface side of the substrate body 11 (see, for example, FIG. 11). The top surface of the second layer 14b of the power plane layer 14 is substantially flush with the top surface of the insulating film 12 covering the second surface 11b of the substrate body 11.

Then, in a process (not illustrated) subsequent to the process illustrated in FIG. 12, the first insulating film 16, the first wiring layer 17, the second insulating layer 18, the second wiring layer 19, and the third insulating layer 20 are sequentially layered on the first surface 11a of the substrate body 11. Further, the fourth insulating layer 21, the third wiring layer 22, the fifth insulating layer 23, the fourth wiring layer 24, and the sixth insulating layer 25 are sequentially layered on the second surface 11b of the substrate body 11.

More specifically, for example, a photosensitive polyimide type resin liquid is applied to the first surface 11a of the substrate body 11 by using a spin-coating method. Then, the first insulating layer 16 is formed by curing the photosensitive polyimide type resin liquid. Then, the first via hole 16x penetrating the first insulating layer 16 and exposing the first end surface of the penetration wiring 15 is formed by using, for example, a photolithography method.

Thus, because a photosensitive insulating resin is used as the material of the first insulating layer 16, the first via hole 16x can be formed in the first insulating layer 16 with a photolithography method. Accordingly, the first via holes 16x can be formed with a narrow pitch. The same applies to a case where the other insulating layers are formed with a photosensitive insulating resin. Alternatively, in a case where there is no need to form the first via holes 16x with a narrow pitch, the material of the first insulating layer 16 may be, for example, a non-photosensitive epoxy resin. In this case, the first via hole 16x is formed by using, for example, a laser process method.

Then, the first wiring layer 17 is formed on the first insulating layer 16. The first wiring layer 17 includes a via wiring that fills the first via hole 16x and a wiring pattern that is formed on the first insulating layer 16. The first wiring layer 17 is electrically connected to the penetration wiring 15 exposed in the first via hole 16x. For example, copper (Cu) may be used as the material of the first wiring layer 17. The first wiring layer 17 may be formed by various wiring forming methods such as a semi-additive method or a subtractive method.

Similarly, the second insulating layer 18, the second wiring layer 19, and the third insulating layer 20 are sequentially layered on the first surface 11a of the substrate body 11. Further, similarly, the fourth insulating layer 21, the third wiring layer 22, the fifth insulating layer 23, the fourth wiring layer 24, and the sixth insulating layer 25 are sequentially layered on the second surface 11b of the substrate body 11. Finally, the manufacturing of the wiring substrate 10 is completed by forming the opening part 20x in the third insulating layer 20 and the opening part 25x in the sixth insulating layer 25.

Hence, with the above-described embodiments of the present invention, by providing the GND plane layer 13 and the power plane layer 14 inside the substrate body 11 instead of providing the GND plane layer 130 and the power plane layer 140 on the substrate body 110, the flatness of the first insulating layer 16 and the fourth insulating layer 21 can be improved (compared to, for example, the related art example) regardless of the thickness of the GND plane layer 13 or the power plane layer 14. Accordingly, other wiring layers and insulating layers can be easily layered on the first insulating layer 16 or the fourth insulating layer 21. Further, because the GND plane layer 13 and the power plane layer 14 can be formed (flatly formed) having a sufficient thickness and size (area), the GND and the potential of the power supply can be more stable compared to, for example, the related art example.

In a case where a flat GND plane layer 130 and a flat power plane layer 140 are provided on the substrate body 110 (e.g., on a $SiO_2$ film) or the first insulating layer 160, the difference of the thermal expansion between the conductive layers (e.g., copper) constituting the GND plane layer 130 and the power plane layer 140 may cause peeling of film or generation of cracks (for example, cracks are more likely to be generated the larger the contact area between the GND plane layer 130 and the substrate body 110 or the contact area between the power plane layer 140 and the substrate body 110). However, in the above-described embodiment of the present invention, thermal expansion of the GND plane layer 13 and the power plane layer 14 can be controlled at the sidewalls of the trenches 11x, 11y by providing the GND plane layer 13 and the power plane layer 14 inside the substrate body 11 (i.e. inside the trenches 11x, 11y). Thus, peeling of film or generation of cracks can be prevented.

In a case where a flat GND plane layer 130 and a flat power plane layer 140 are provided on the substrate body 110 (e.g., on a $SiO_2$ film) or the first insulating layer 160, the GND plane layer 130 and the power plane layer 140 are to be formed avoiding areas of the substrate body 110 or the first insulating layer 160 on which other wiring patterns are to be formed. In addition, in a case of forming wiring patterns in the same layer as the GND plane layer 130 and the power plane layer 140, the arrangement of the wiring patterns is limited. However, with the above-described embodiment of the wiring substrate 10, the other wiring patterns can be freely arranged because the GND plane layer 13 and the power plane layer 14 are formed inside the substrate body 11 (i.e. inside the trenches 11x, 11y).

In a case of forming each wiring layer by, for example, electroplating with copper, the plating thicknesses of the wiring layers becomes more inconsistent the greater the occupancy of copper in the wiring layers. However, with the above-described embodiment of the wiring substrate 10, the copper occupancy in each wiring layer of the wiring substrate 10 can be reduced by providing the GND plane layer 13 and the power plane layer 14 that have high copper occupancy. Thereby, inconsistent plating thickness of each of the wiring layers can be prevented.

Further, by providing the GND plane layer 13 and the power plane layer 14 inside the substrate body 11, the thickness of the wiring substrate 10 can be reduced.

Because flattening of the GND plane layer 13 and flattening of the penetration wiring 15 can be performed in the same process (i.e. process illustrated in FIG. 12), manufacturing of the wiring substrate 10 can be simplified.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

The invention claimed is:
1. A wiring substrate comprising:
a substrate body formed of silicon and including a first surface and a second surface;
a first trench including an inner bottom surface and an inner side surface and being formed in a first surface side of the substrate body;
a second trench including an inner bottom surface and an inner side surface and being formed in a second surface side of the substrate body;
a penetration hole including an inner side surface and penetrating through the substrate body;
an insulating film formed on the first surface of the substrate body, the second surface of the substrate body, the inner bottom surface and the inner side surface of the first trench, the inner bottom surface and the inner side surface of the second trench, and the inner side surface of the penetration hole;
a first plane layer filling the first trench and being substantially flush with an upper surface of the insulating film that covers the first surface of the substrate body;
a second plane layer filling the second trench and being substantially flush with the upper surface of the insulating film that covers the second surface of the substrate body; and
a penetration wiring filling the penetration hole and being substantially flush with the upper surface of the insulating film that covers the first and second surfaces of the substrate body;

wherein multiple insulating layers and multiple wiring layers are formed on the first surface side of the substrate body and the second surface side of the substrate body, wherein the first plane layer is a reference potential layer, wherein the second plane layer is a power supply layer.

2. The wiring substrate as claimed in claim 1, wherein the first plane layer is formed on a side of the substrate body on which a semiconductor chip is mounted.

3. The wiring substrate as claimed in claim 1, wherein the first plane layer has an exposed surface toward the first surface side and being flush with the first surface, wherein the second plane layer has an exposed surface toward the second surface side and being flush with the second surface, wherein the penetrating wiring has first and second exposed surfaces, the first exposed surface facing the first surface side and being flush with the first surface, the second exposed surface facing the second surface side and being flush with the second surface.

4. The wiring substrate as claimed in claim 1, wherein the penetration wiring includes first, second, and third layers, wherein the first layer fills at least a portion of the penetration hole on the second surface side, wherein the second layer covers an inner bottom surface and an inner side surface of a recess that is formed by an end surface of the first layer on the first surface side and an inner side surface of the penetration hole, wherein the third layer covers the second layer and fills the recess.

5. The wiring substrate as claimed in claim 1, wherein at least one of the multiple wiring layers is electrically connected to the penetration wiring.

6. The wiring substrate as claimed in claim 5, wherein the first and the second plane layers have a thickness that is greater than a thickness of the at least one of the multiple wiring layers, respectively.

7. The wiring substrate as claimed in claim 5, wherein the at least one of the multiple insulating layers includes a photosensitive insulating resin.

* * * * *